US011875858B2

(12) United States Patent
Tanaka

(10) Patent No.: US 11,875,858 B2
(45) Date of Patent: Jan. 16, 2024

(54) MEMORY TRUE ERASE WITH PULSE STEPS TO FACILITATE ERASE SUSPEND

(71) Applicant: Micron Technology, Inc., Boise, ID (US)

(72) Inventor: Tomoharu Tanaka, Yokohama (JP)

(73) Assignee: Micron Technology, Inc., Boise, ID (US)

( * ) Notice: Subject to any disclaimer, the term of this patent is extended or adjusted under 35 U.S.C. 154(b) by 159 days.

(21) Appl. No.: 17/590,742

(22) Filed: Feb. 1, 2022

(65) Prior Publication Data

US 2023/0043066 A1 Feb. 9, 2023

Related U.S. Application Data

(60) Provisional application No. 63/231,059, filed on Aug. 9, 2021.

(51) Int. Cl.
| | |
|---|---|
| *G11C 16/14* | (2006.01) |
| *G11C 16/34* | (2006.01) |
| *G11C 16/04* | (2006.01) |
| *G06F 3/06* | (2006.01) |
| *G11C 16/22* | (2006.01) |

(52) U.S. Cl.
CPC .......... *G11C 16/14* (2013.01); *G06F 3/0604* (2013.01); *G06F 3/0652* (2013.01); *G06F 3/0679* (2013.01); *G11C 16/0483* (2013.01); *G11C 16/225* (2013.01); *G11C 16/3445* (2013.01)

(58) Field of Classification Search
None
See application file for complete search history.

(56) References Cited

U.S. PATENT DOCUMENTS

| | | | | |
|---|---|---|---|---|
| 5,333,300 A | * | 7/1994 | Fandrich ................ | G11C 16/10 711/103 |
| 5,832,493 A | * | 11/1998 | Marshall ............... | G06F 16/902 707/E17.038 |
| 2017/0285969 A1 | | 10/2017 | Madraswala et al. | |
| 2018/0024772 A1 | * | 1/2018 | Madraswala ......... | G06F 3/0679 711/103 |

* cited by examiner

*Primary Examiner* — Tan T. Nguyen
(74) *Attorney, Agent, or Firm* — Lowenstein Sandler LLP

(57) ABSTRACT

A memory device includes a memory array of memory cells and control logic operatively coupled to the memory array. The control logic to perform memory erase operations including: performing a true erase sub-operation by causing multiple pulse steps to be applied sequentially to a group of memory cells of the memory array, wherein each sequential pulse step of the multiple pulse steps occurs during a pulse-step period and at a higher voltage compared to an immediately-preceding pulse-step; in response to detecting an erase suspend command during a pulse step, suspending the true erase sub-operation at a start of a subsequent pulse-step period after the pulse step; and resuming the true erase sub-operation at an end of the subsequent pulse-step period.

20 Claims, 13 Drawing Sheets

|  $350_0$ | $350_1$ | $350_2$ | $350_3$ |
|---|---|---|---|
| Block$_0$ 250$_0$ | Block$_0$ 250$_0$ | Block$_0$ 250$_0$ | Block$_0$ 250$_0$ |
| Block$_1$ 250$_1$ | Block$_1$ 250$_1$ | Block$_1$ 250$_1$ | Block$_1$ 250$_1$ |
| Block$_2$ 250$_2$ | Block$_2$ 250$_2$ | Block$_2$ 250$_2$ | Block$_2$ 250$_2$ |
| Block$_3$ 250$_3$ | Block$_3$ 250$_3$ | Block$_3$ 250$_3$ | Block$_3$ 250$_3$ |
| Block$_4$ 250$_4$ | Block$_4$ 250$_4$ | Block$_4$ 250$_4$ | Block$_4$ 250$_4$ |
| ⋮ | ⋮ | ⋮ | ⋮ |
| Block$_{L-4}$ 250$_{L-4}$ | Block$_{L-4}$ 250$_{L-4}$ | Block$_{L-4}$ 250$_{L-4}$ | Block$_{L-4}$ 250$_{L-4}$ |
| Block$_{L-3}$ 250$_{L-3}$ | Block$_{L-3}$ 250$_{L-3}$ | Block$_{L-3}$ 250$_{L-3}$ | Block$_{L-3}$ 250$_{L-3}$ |
| Block$_{L-2}$ 250$_{L-2}$ | Block$_{L-2}$ 250$_{L-2}$ | Block$_{L-2}$ 250$_{L-2}$ | Block$_{L-2}$ 250$_{L-2}$ |
| Block$_{L-1}$ 250$_{L-1}$ | Block$_{L-1}$ 250$_{L-1}$ | Block$_{L-1}$ 250$_{L-1}$ | Block$_{L-1}$ 250$_{L-1}$ |
| Block$_L$ 250$_L$ | Block$_L$ 250$_L$ | Block$_L$ 250$_L$ | Block$_L$ 250$_L$ |
| 240$_0$ | 240$_1$ | 240$_2$ | 240$_3$ |

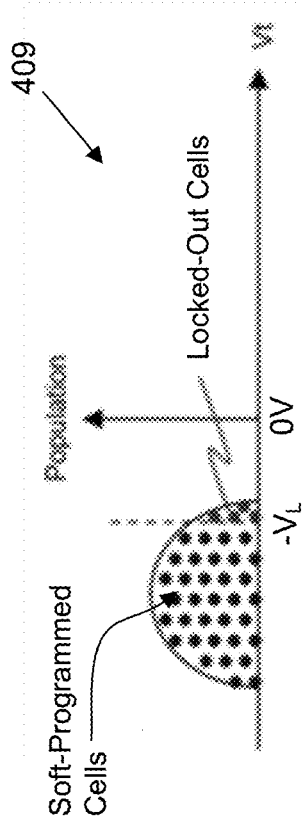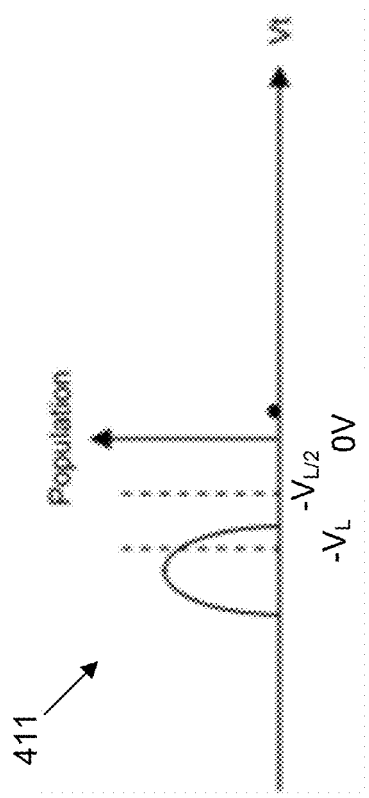
FIG. 4C
FIG. 4D

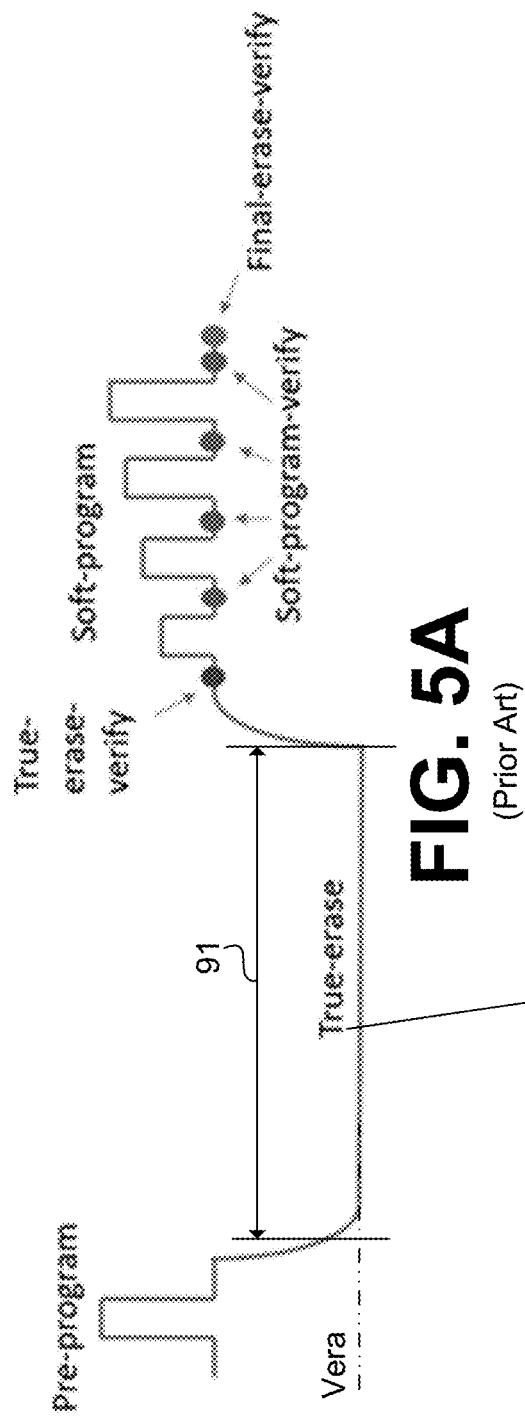
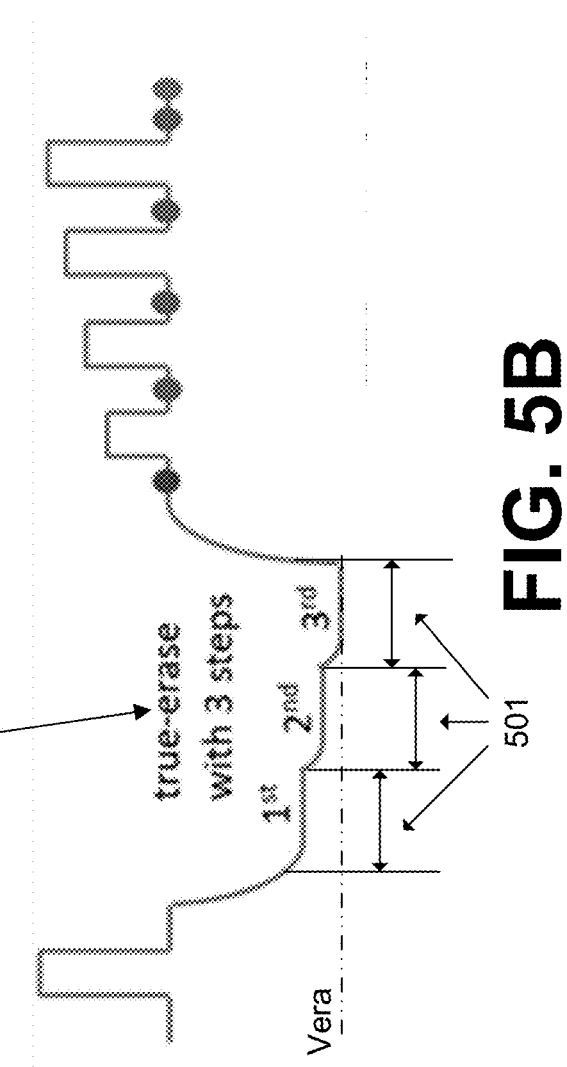
FIG. 5A (Prior Art)
FIG. 5B

MEMORY TRUE ERASE WITH PULSE STEPS TO FACILITATE ERASE SUSPEND

REFERENCE TO RELATED APPLICATION

This application claims the benefit of U.S. Provisional Patent Application No. 63/231,059, filed Aug. 9, 2021, the entirety of which is incorporated herein by reference.

TECHNICAL FIELD

Embodiments of the disclosure are generally related to memory sub-systems, and more specifically, relate to memory true erase with pulse steps to facilitate erase suspend.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

FIG. 3 is a block schematic of a portion of an array of memory cells as could be used in a memory of the type described with reference to FIG. 1B according to an embodiment.

FIG. 4C is a voltage waveform depiction of the population of erased memory cells during a subsequent soft-program verify sub-operation according to some embodiments.

FIG. 4D is a voltage waveform depiction of the population of erased memory cells during a final erase verify sub-operation according to some embodiments.

FIG. 5A is a voltage waveform depiction of a true erase sub-operation that employs a single pulse according to an embodiment.

FIG. 5B is a voltage waveform depiction of a true erase sub-operation that employs a series of increasingly-higher pulse steps according to at least one embodiment.

DETAILED DESCRIPTION

Figure 1A:
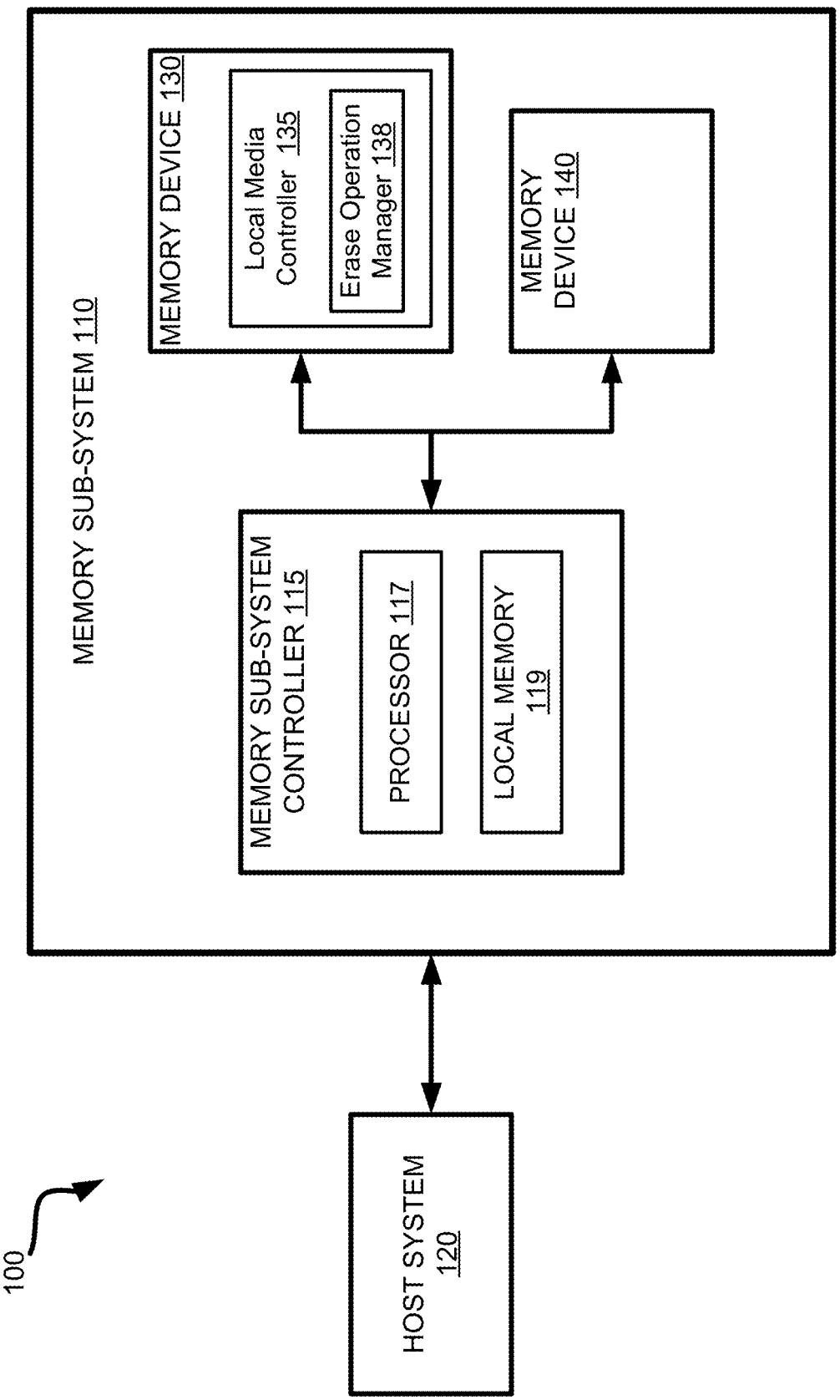
FIG. 1A illustrates an example computing system that includes a memory sub-system in accordance with some embodiments.

Embodiments of the present disclosure are directed to memory true erase with pulse steps to facilitate erase suspend. A memory device can be a non-volatile memory device. One example of non-volatile memory devices is a negative-and (NAND) memory device. Other examples of non-volatile memory devices are described below in conjunction with FIG. 1A. In certain memory devices such as NAND (or flash) memory devices, memory cells are erased before the memory cells are programmed, generally referred to as program/erase cycles.

In these memory devices, each erase operation can include a number of sub-operations such as pre-program, true erase, true erase verify, soft-program, soft-program verify, and final erase verify, each of which will be discussed in more detail. Each of these sub-operations takes a relatively short time, e.g., 40-60 microsecond (µs), except for the true erase sub-operation, which can take up to 1 millisecond (ms) or longer, for example. A true erase sub-operation involves applying an actual erase pulse to the memory cells that are undergoing erasure. The true erase sub-operation takes a significantly lengthy period of time (or duration) compared to other memory operations and compared to other sub-operations of the erase operation. The duration of a true erase sub-operation is lengthy due to a significant bias voltage (Vera) of an erase pulse, e.g., of around 18-22 volts (V), applied to strings of memory cells being erased. It takes a significant length of time to ramp up to this bias voltage and a significant amount of time for the strings of memory cells to recover, e.g., discharge, after the true erase sub-operation is completed.

For example, in a NAND memory device, a read operation is faster than an erase operation, and read operations are typically given priority over erase operations. For this reason, erase operations are often repeatedly interrupted when a host system (or coupled memory sub-system controller) sends a suspend command in order to temporarily suspend the erase operation in favor of instead performing a read or other memory operation. The erase suspend command can be of a "forward progress" type in which the erase operation is not immediately suspended in favor of completing the current sub-operation before actual suspension of the erase operation. Enabling forward progress can be understood as efficient and also safe in enabling the memory structure of the memory device to complete voltage ramping and/or recovery naturally.

Accordingly, if the suspend command interrupts an erase operation during the true erase sub-operation, the memory operation with higher priority (such as a read operation) still has to wait for the long duration of the true erase sub-operation to complete before the suspend command can be executed and the memory operation be able to complete.

This significant delay whenever the suspend command is received during the true erase sub-operation significantly negatively impacts quality of service (QoS) performance of the memory device. For example, the latency repeatedly caused by waiting for the true erase sub-operation to be completed when interrupted by a suspend command can noticeable slow memory performance.

Aspects of the present disclosure address the above and other deficiencies by dividing the erase pulse into multiple pulse steps, thus incorporating natural breaks in the ramping of the string of memory cells to an erase voltage bias (Vera). If an erase suspend command arrives during a true erase sub-operation, the erase operation can be suspended immediately within a short period of time, e.g., no longer than the pulse-step period of each pulse step. In some embodiments, the multiple pulse steps are at least three pulse steps, but additional pulse steps are envisioned. In one embodiment, the pulse-step period is approximately a length of time of erase sub-operations other than the true erase sub-operation. The erase operation can then be resumed immediately within another pulse-step period, making the overall wait time significantly less, e.g., on the order of 20 times quicker than a typical duration of the true erase sub-operation.

In one embodiment, a memory device includes a memory array of memory cells and control logic operatively coupled to the memory array. The control logic can be adapted to perform operations to execute erase operations, among other memory operations. In at least some embodiments, the memory erase operations include causing, during a true erase sub-operation, multiple pulse steps to be applied sequentially to a group of memory cells of the memory array. Each sequential pulse step of the multiple pulse steps can occur during a pulse-step period and at a higher voltage compared to an immediately-preceding pulse-step. Each pulse-step period can be a length of time significantly less than the length of the entire true erase sub-operation. The operations can further include, in response to detecting an erase suspend command during a pulse step, suspending the true erase sub-operation at a start of a subsequent pulse-step period after the pulse step and resuming the true-erase sub-operation at an end of the subsequent pulse-step period.

Therefore, advantages of the systems and methods implemented in accordance with some embodiments of the present disclosure include, but are not limited to, significant improvement of QoS related to memory performance by reducing latency due to erase suspend commands received during a true erase sub-operation of erase operations. Further, due to the more linear progress of the Vt distribution of the group of memory cells being erased when using pulse steps, resuming an erase operation can be done more accurately compared to doing so when using a single erase pulse. Other advantages will be apparent to those skilled in the art of memory operations, to include erase operations, associated with a memory device discussed hereinafter.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices. The memory sub-system 110 can be a storage device, a memory module, or a hybrid of a storage device and memory module.

The memory device 130 can be a non-volatile memory device. One example of non-volatile memory devices is a negative-and (NAND) memory device. A non-volatile memory device is a package of one or more dice. Each die can include one or more planes. Planes can be groups into logic units (LUN). For some types of non-volatile memory devices (e.g., NAND devices), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1," or combinations of such values.

The memory device 130 can be made up of bits arranged in a two-dimensional or three-dimensional grid, also referred to as a memory array. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface, Open NAND Flash Interface (ONFI) interface, or some other interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In some embodiments, control logic of the local media controller 135 can implement an erase operation manager 138. The erase operation manager 138 can perform the true erase sub-operations with pulse steps to facilitate erase suspend, as described in more detail below. In some embodiments, the erase operation manager 138 is integrated in whole or in part within the memory sub-system controller 115 and/or the host system 120.

Figure 1B:
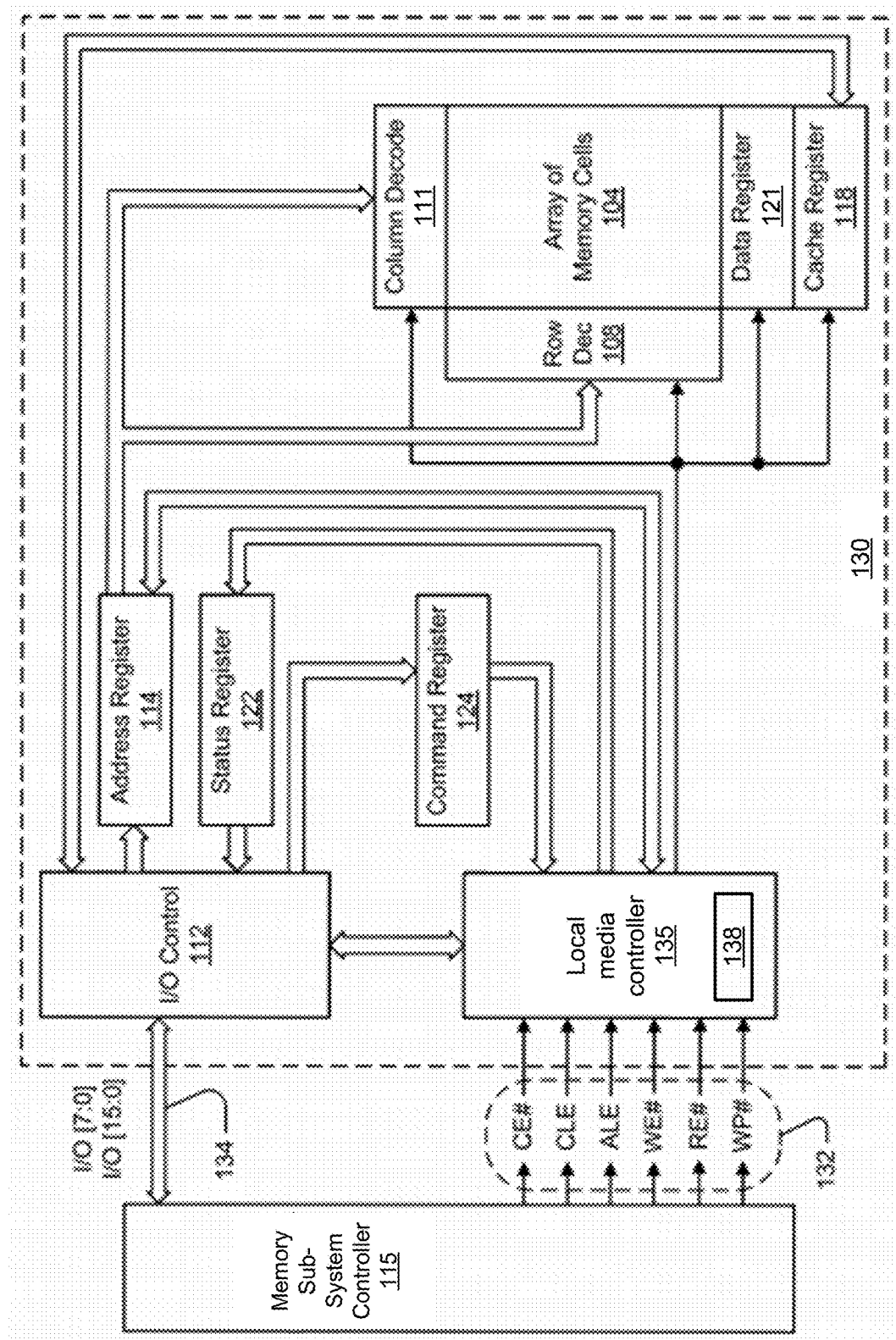
FIG. 1B is a block diagram of a memory device in communication with a memory sub-system controller of a memory sub-system according to an embodiment.

FIG. 1B is a simplified block diagram of a first apparatus, in the form of a memory device 130, in communication with a second apparatus, in the form of a memory sub-system controller 115 of a memory sub-system (e.g., the memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

The memory device 130 includes an array of memory cells 104 logically arranged in rows and columns. Memory cells of a logical row are typically connected to the same access line (e.g., a word line) while memory cells of a logical column are typically selectively connected to the same data line (e.g., a bit line). A single access line can be associated with more than one logical row of memory cells and a single data line can be associated with more than one logical column. Memory cells (not shown in FIG. 1B) of at least a portion of the array of memory cells 104 are capable of being programmed to one of at least two target data states.

Row decode circuitry 108 and column decode circuitry 111 are provided to decode address signals. Address signals are received and decoded to access the array of memory cells 104. The memory device 130 also includes input/output (I/O) control circuitry 112 to manage input of commands, addresses and data to the memory device 130 as well as output of data and status information from the memory device 130. An address register 114 is in communication with the I/O control circuitry 112 and row decode circuitry 108 and column decode circuitry 111 to latch the address signals prior to decoding. A command register 124 is in communication with the I/O control circuitry 112 and the local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. In at least some embodiments, the local media controller 135 includes the erase operation manager 138. The local media controller 135 is in communication with row decode circuitry 108 and column decode circuitry 111 to control the row decode circuitry 108 and column decode circuitry 111 in response to the addresses.

The local media controller 135 is also in communication with a cache register 118 and a data register 121. The cache register 118 latches data, either incoming or outgoing, as directed by the local media controller 135 to temporarily store data while the array of memory cells 104 is busy writing or reading, respectively, other data. During a program operation (e.g., write operation), data can be passed from the cache register 118 to the data register 121 for transfer to the array of memory cells 104; then new data can be latched in the cache register 118 from the I/O control circuitry 112. During a read operation, data can be passed from the cache register 118 to the I/O control circuitry 112 for output to the memory sub-system controller 115; then new data can be passed from the data register 121 to the cache register 118. The cache register 118 and/or the data register 121 can form (e.g., can form at least a portion of) the page buffer of the memory device 130. The page buffer can further include sensing devices such as a sense amplifier, to sense a data state of a memory cell of the array of memory cells 104, e.g., by sensing a state of a data line connected to that memory cell. A status register 122 can be in communication with I/O control circuitry 112 and the local memory controller 135 to latch the status information for output to the memory sub-system controller 115.

The memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) can be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands can be received over input/output (I/O) pins [7:0] of I/O bus 134 at I/O control circuitry 112 and can then be written into a command register 124. The addresses can be received over input/output (I/O) pins [7:0] of I/O bus 134 at I/O control circuitry 112 and can then be written into address register 114. The data can be received over input/output (I/O) pins [7:0] for an 8-bit device or input/output (I/O) pins [15:0] for a 16-bit device at I/O control circuitry 112 and then can be written into cache register 118. The data can be subsequently written into data register 121 for programming the array of memory cells 104.

In an embodiment, cache register 118 can be omitted, and the data can be written directly into data register 121. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) can be used in the various embodiments.

Figure 2A:
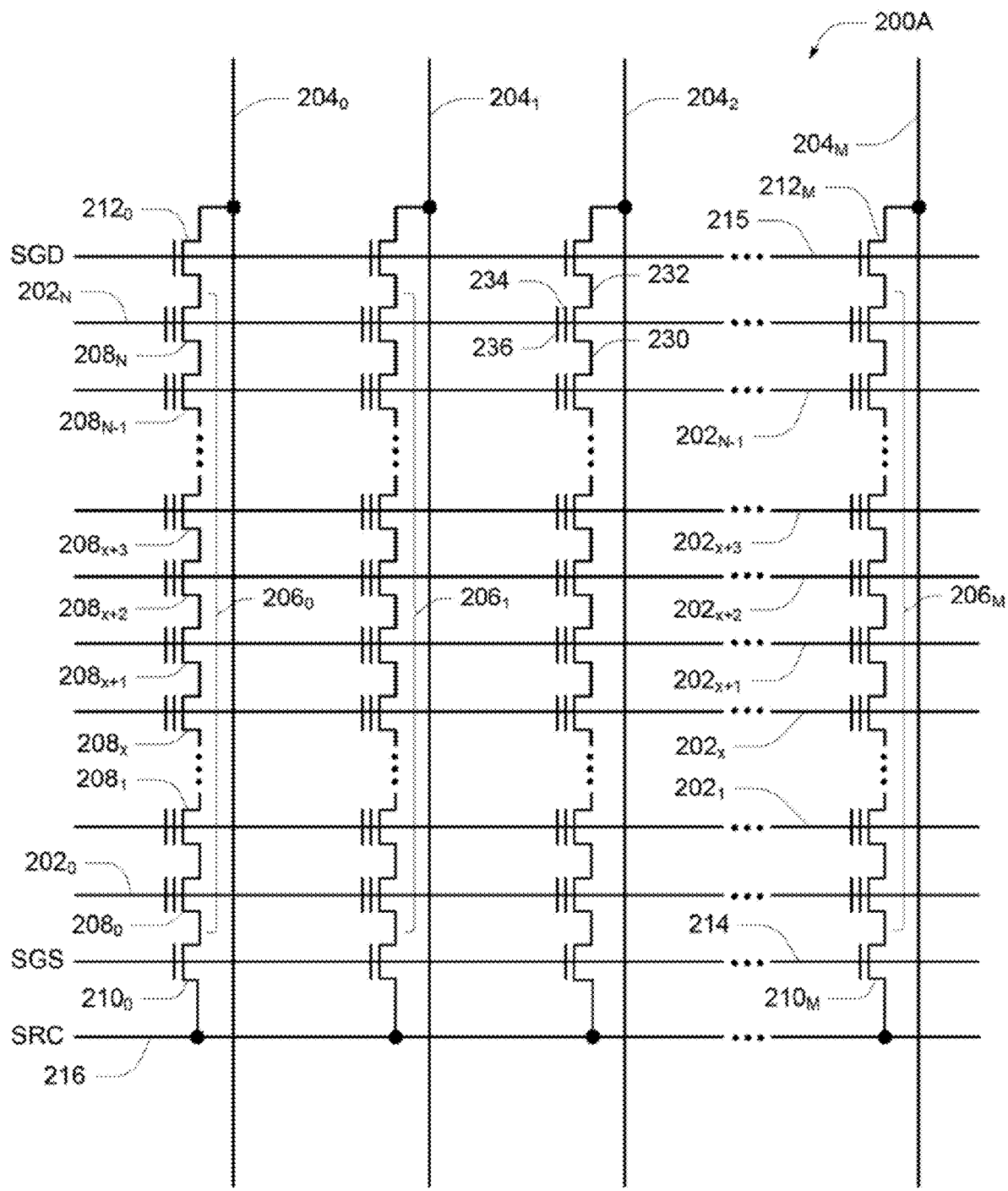
FIG. 2A-2C are schematics of portions of an array of memory cells as could be used in a memory of the type described with reference to FIG. 1B according to an embodiment.
Figure 2B:
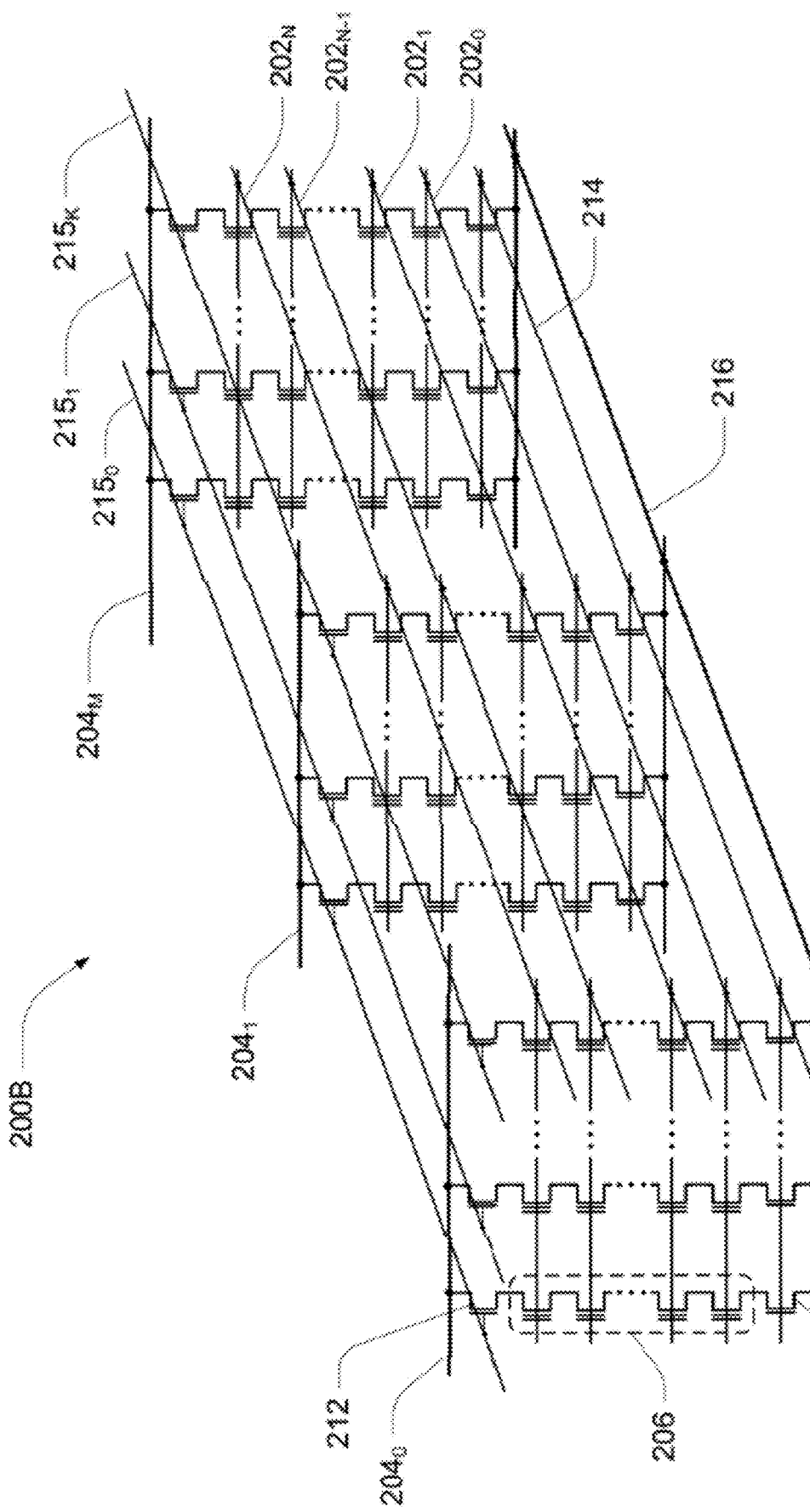
Figure 2C:
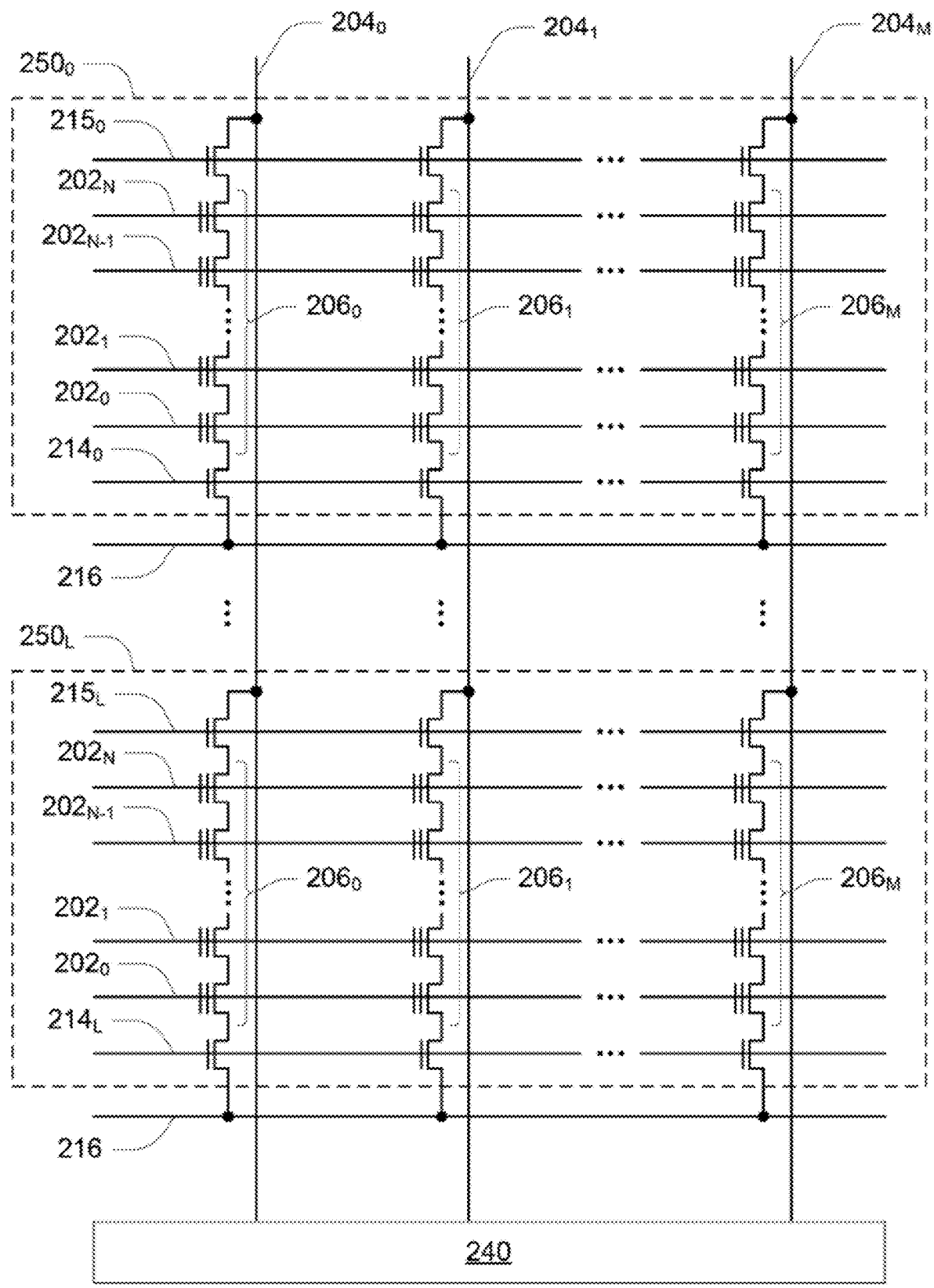

FIG. 2A-2C are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as word lines $202_0$ to $202_N$, and data lines, such as bit lines $204_0$ to $204_M$. The word lines 202 can be connected to global access lines (e.g., global word lines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a word line 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

The memory array 200A in FIG. 2A can be a quasi-two-dimensional memory array and can have a generally planar structure, e.g., where the common source 216, NAND strings 206 and bit lines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a word line 202.

A column of the memory cells 208 can be a NAND string 206 or a number of NAND strings 206 selectively connected to a given bit line 204. A row of the memory cells 208 can be memory cells 208 commonly connected to a given word line 202. A row of memory cells 208 can, but need not, include all the memory cells 208 commonly connected to a given word line 202. Rows of the memory cells 208 can often be divided into one or more groups of physical pages of memory cells 208, and physical pages of the memory cells 208 often include every other memory cell 208 commonly connected to a given word line 202. For example, the memory cells 208 commonly connected to word line $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to word line $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2A, it is apparent from the figure that the bit lines 204 of the array of memory cells 200A can be numbered consecutively from bit line $204_0$ to bit line $204_M$. Other groupings of the memory cells 208 commonly connected to a given word line 202 can also define a physical page of memory cells 208. For certain memory devices, all memory cells commonly connected to a given word line can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bit line $204_0$-$204_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 can be connected to multiple rows of memory cells of the memory array 200B. Rows of memory cells that are commonly connected to each other by a particular word line 202 can collectively be referred to as tiers.

FIG. 2C is a further schematic of a portion of an array of memory cells 200C as could be used in a memory of the type described with reference to FIG. 1B, e.g., as a portion of the array of memory cells 104. Like numbered elements in FIG. 2C correspond to the description as provided with respect to FIG. 2A. The array of memory cells 200C can include strings of series-connected memory cells (e.g., NAND strings) 206, access (e.g., word) lines 202, data (e.g., bit) lines 204, select lines 214 (e.g., source select lines), select lines 215 (e.g., drain select lines) and a source 216 as depicted in FIG. 2A. A portion of the array of memory cells 200A can be a portion of the array of memory cells 200C, for example.

FIG. 2C depicts groupings of NAND strings 206 into blocks of memory cells 250, e.g., blocks of memory cells $250_0$-$250_L$. Blocks of memory cells 250 can be groupings of memory cells 208 that can be erased together in a single erase operation, sometimes referred to as erase blocks. Each block of memory cells 250 can represent those NAND strings 206 commonly associated with a single select line 215, e.g., select line $215_0$. The source 216 for the block of memory cells $250_0$ can be a same source as the source 216 for the block of memory cells $250_L$. For example, each block of memory cells $250_0$-$250_L$ can be commonly selectively connected to the source 216. Access lines 202 and select lines 214 and 215 of one block of memory cells 250 can have no direct connection to access lines 202 and select lines 214 and 215, respectively, of any other block of memory cells of the blocks of memory cells $250_0$-$250_L$.

The bit lines $204_0$-$204_M$ can be connected (e.g., selectively connected) to a buffer portion 240, which can be a portion of the page buffer of the memory device 130. The buffer portion 240 can correspond to a memory plane (e.g., the set of blocks of memory cells $250_0$-$250_L$). The buffer portion 240 can include sense circuits (which can include sense amplifiers) for sensing data values indicated on respective bit lines 204.

FIG. 3 is a block schematic of a portion of an array of memory cells 300 as could be used in a memory of the type described with reference to FIG. 1B. The array of memory cells 300 is depicted as having four memory planes 350 (e.g., memory planes $350_0$-$350_3$), each in communication with a respective buffer portion 240, which can collectively form a page buffer 352. While four memory planes 350 are depicted, other numbers of memory planes 350 can be commonly in communication with a page buffer 352. Each memory plane 350 is depicted to include L+1 blocks of memory cells 250 (e.g., blocks of memory cells $250_0$-$250_L$).

Figure 4A:
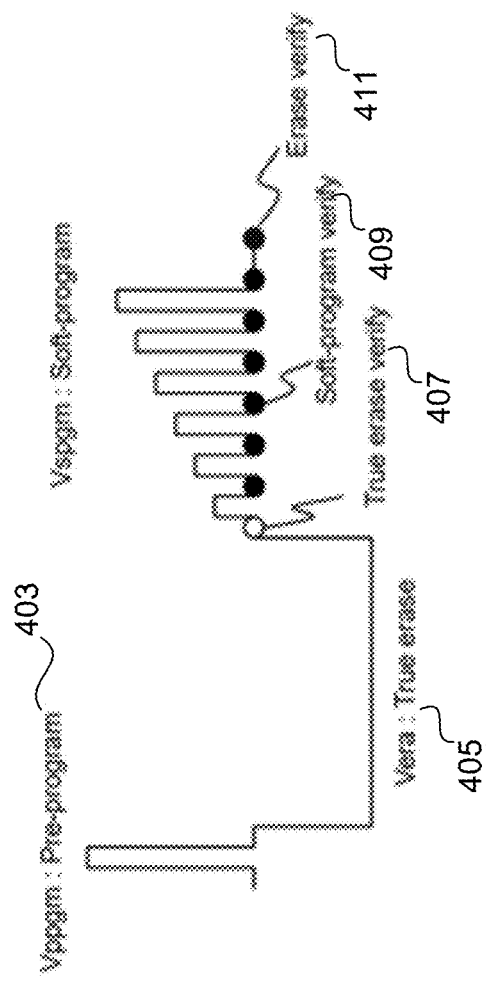
FIG. 4A is a voltage waveform depiction of an erase operation a specified group of memory cells (e.g., of a block of memory cells) of a memory array according to some embodiments.

FIG. 4A is a voltage waveform depiction of an erase operation of a specified group of memory cells (e.g., a block of memory cells) of a memory array according to some embodiments. During a pre-program sub-operation 403, which is optional, the memory device 130 can apply soft-program voltages to the word lines of the specified group of memory cells to pre-condition the memory array to avoid over-erasing. In some embodiments, a group of memory cells that are targeted for an erase operation are organized as a physical block of memory cells. In other embodiments, the group of memory cells targeted for an erase operation include one or more strings of memory cells.

During a true erase sub-operation 405, the local media controller 135 (e.g., the erase operation manager 138) can cause a common source voltage line, e.g., the SRC 216 (FIG. 2A), to be ramped to an erase voltage (Vera) with an erase pulse while the select gates $210_0$ to $210_M$ (SGS transistors) are turned on. As discussed, ramping to this high bias erase voltage, and the subsequent recovery from this voltage ramping, takes a significant amount of time. Concurrently, the erase operation manager 138 can cause the select gates $212_0$ to $212_M$ (FIG. 2A) to be turned off to enable the drains of the select gates $212_0$ to $212_M$ to float, which causes the bit lines $204_0$ to $204_M$ to also float. Further, the erase operation manager 138 can couple the word lines 202 (FIG. 2A) to ground, e.g., zero volts. This set of voltage levels at the memory array 200A can create an erase potential that causes the memory cells $208_0$ to $208_N$ to be erased, e.g., forces electrons to exit through a body of each memory cell and out the floating bit lines $204_0$ to $204_M$.

After the memory cells $208_0$ to $208_N$ have been erased, the erase operation manager 138 can perform a series of erase/program verify sub-operations to ensure the memory cells $208_0$ to $208_N$ of the group of memory cells have a voltage distribution around a particular threshold voltage range, e.g., below and/or around a small negative voltage ($-V_L$), e.g., $-1.5$, $-1.25V$, $-1.0V$, or the like. These different verify sub-operations can include a true erase verify sub-operation 407, a soft-program verify sub-operation 409, and a final erase verify sub-operation 411, which are discussed with reference to FIGS. 4B-4D, respectively.

Figure 4B:
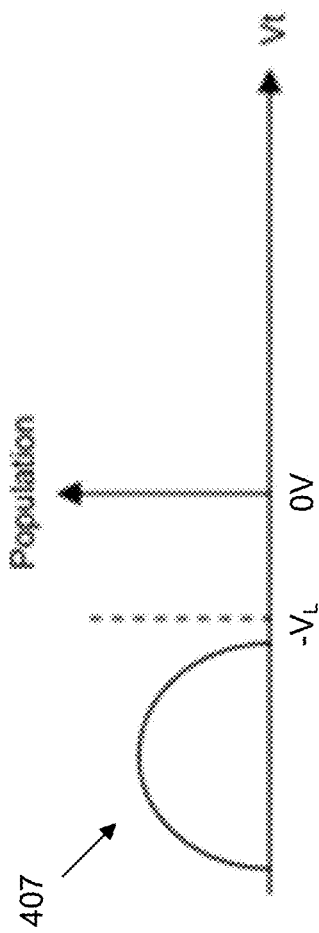
FIG. 4B is a voltage waveform depiction of a population of erased memory cells during a true erase verify sub-operation according to some embodiments.

FIG. 4B is a voltage waveform depiction of a population of erased memory cells during the true erase verify sub-operation 407 according to some embodiments. During a true erase verify sub-operation 407, the erase operation manager 138 can determine whether the threshold voltage (Vt) distribution of the erased memory cells is below $-V_L$. If the Vt distribution includes some portion that meets or exceeds $-V_L$, the true erase verify sub-operation 407 can be considered to have failed.

FIG. 4C is a voltage waveform depiction of the population of erased memory cells during a subsequent soft-program verify sub-operation 409 according to some embodiments. The soft-program verify sub-operation 409 can be applied between soft program operations, which includes causing application of a series of low-voltage program pulses to bring the erase state of the Vt distribution closer to $-V_L$, but still below 0V. The soft-program verify sub-operation 409 can be performed after each soft program operation to verify the erase state of the Vt distribution is closer to $-V_L$, but still below 0V. Any cells of the group of erased memory cells that happen to be programmed to higher than $-V_L$ during a soft program can be locked out, e.g., inhibited during a next soft-program verify sub-operation.

FIG. 4D is a voltage waveform depiction of the population of erased memory cells during the final erase verify sub-operation 411 according to some embodiments. During the final erase verify sub-operation 411, the memory operation manager 138 can ensure the Vt distribution of the group of erased memory cells is still below an even smaller negative voltage ($-V_{L/2}$), e.g., which can be understood to be about half of $-V_L$. If any part of the Vt distribution meets or exceeds $-V_{L/2}$, then the final erase verify sub-operation 411 can be considered to have failed.

FIG. 5A is a voltage waveform depiction of a true erase sub-operation that employs a single pulse according to an embodiment. As discussed, in certain memory devices, the true erase sub-operation is performed with a single pulse in order to ramp a common source voltage (Vsrc) to the erase voltage (Vera). Doing so can cause significant delays both in ramping to reach Vera and in the recovery to discharge this higher erase voltage. A time period 91 (or duration) of the signal pulse is illustrated for purposes of comparison with the multiple pulse steps (FIG. 5B).

FIG. 5B is a voltage waveform depiction of a true erase sub-operation that employs a series of increasingly-higher pulse steps according to at least one embodiment. In this way, the erase voltage of Vsrc can be increased incrementally towards Vera but can be paused in between pulse steps, e.g., to allow handling of a suspend command. The illustrated three pulse steps is exemplary, and can include more or fewer pulse steps, depending on a length of each pulse-step period 501 and a total length of the true erase sub-operation. Each pulse-step period 501 can be the same length (or duration) of time, e.g., for predictability in handling erase resume commands, as will be discussed. Further, in some embodiments, each pulse step is stepped up (increased) by the same voltage amount in each sequential pulse step, e.g., $1^{st}$, $2^{nd}$, $3^{rd}$, and so forth.

Figure 6A:
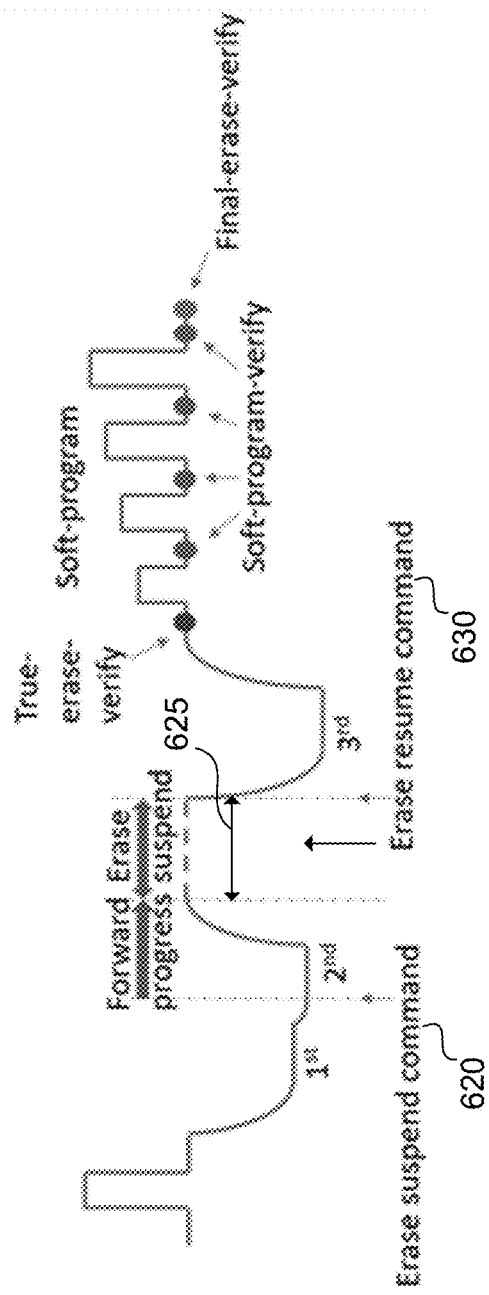
FIG. 6A is a voltage waveform depiction of a suspend command being handled during one of the pulse steps illustrated in FIG. 5B according to at least one embodiment.

FIG. 6A is a voltage waveform depiction of a suspend command being handled during one of the pulse steps illustrated in FIG. 5B according to at least one embodiment. As illustrated, during one of the pulse steps (the second in this case), an erase suspend command 620 is received. In response to detecting an erase suspend command during a pulse step, the erase operation manager 138 can cause the true erase sub-operation to be suspended at the start of a subsequent pulse-step period 625 after the pulse step. Suspension of the true erase sub-operation can be understood as temporarily pausing progress of operation, and thus, as illustrated, skipping a pulse step during the subsequent pulse-step period 625. Waiting until the start of the subsequent pulse step period 625 to officially "pause" operation can be attributed to the forward progress aspect of the erase operation. In various embodiments, the memory device 130 can direct execution of a memory operation (such as a read operation or a write operation) to be performed during subsequent pulse step period 625.

In at least one embodiment, the erase operation manager 138 further resumes the true erase sub-operation at an end of the subsequent pulse-step period 625. In at least another embodiment, the erase operation manager 138 further detects an erase resume command 630 before the end of the subsequent pulse step period 625. In response to the detection, the erase operation manager 138 can resume the true erase sub-operation at the end of the subsequent pulse-step period 625.

Figure 6B:
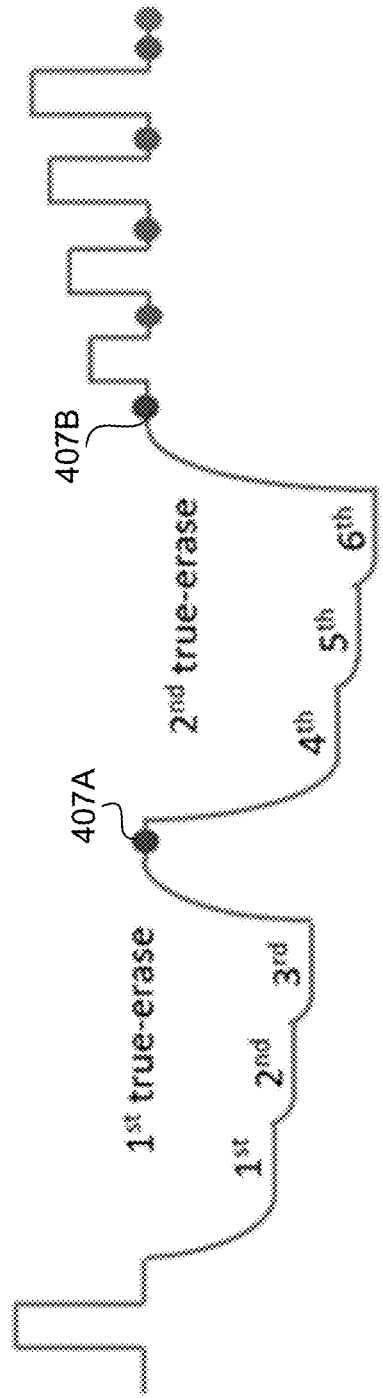
FIG. 6B is a voltage waveform depiction of handling a failure of a true erase verify sub-operation while using pulse steps to perform the true erase according to at least one embodiment.

FIG. 6B is a voltage waveform depiction of handling a failure of a true erase verify sub-operation while using pulse steps to perform the true erase according to at least one embodiment. In some embodiments, in response to receiving no erase suspend command during the true erase sub-operation, the erase operation manager 138 can cause a true erase verify sub-operation 407A to be performed on the group of memory cells. Further, after an erase resume command is received and the true erase sub-operation 407A is completed (as illustrated in FIG. 6A), the erase operation manager 138 can cause a true erase verify sub-operation to be performed on the group of memory cells.

If the true erase verify sub-operation 407A fails, the erase operation manager 138 can resume the true erase sub-operation of the erase operation. As illustrated, resuming the true erase sub-operation means causing pulse steps of higher voltage (and the same pulse-step period) be applied to the group of memory cells. For example, in one embodiment, a subsequent pulse step (the $4^{th}$ as illustrated) after resuming the true erase sub-operation is a higher voltage than a pulse step (the $3^{rd}$ as illustrated) that was applied immediately before the true erase verify sub-operation 407A. The series of pulse steps (e.g., $5^{th}$, $6^{th}$, ...) that continue to be sent to the group of memory cells are likewise of a progressively higher voltage. Thus, at the end of another true erase time period, the erase operation manager 138 can cause a second true erase verify sub-operation 407B to be performed. As illustrated, this second true erase verify sub-operation 407B passed, and thus moved on to perform a soft-program verify sub-operation.

Figure 7:
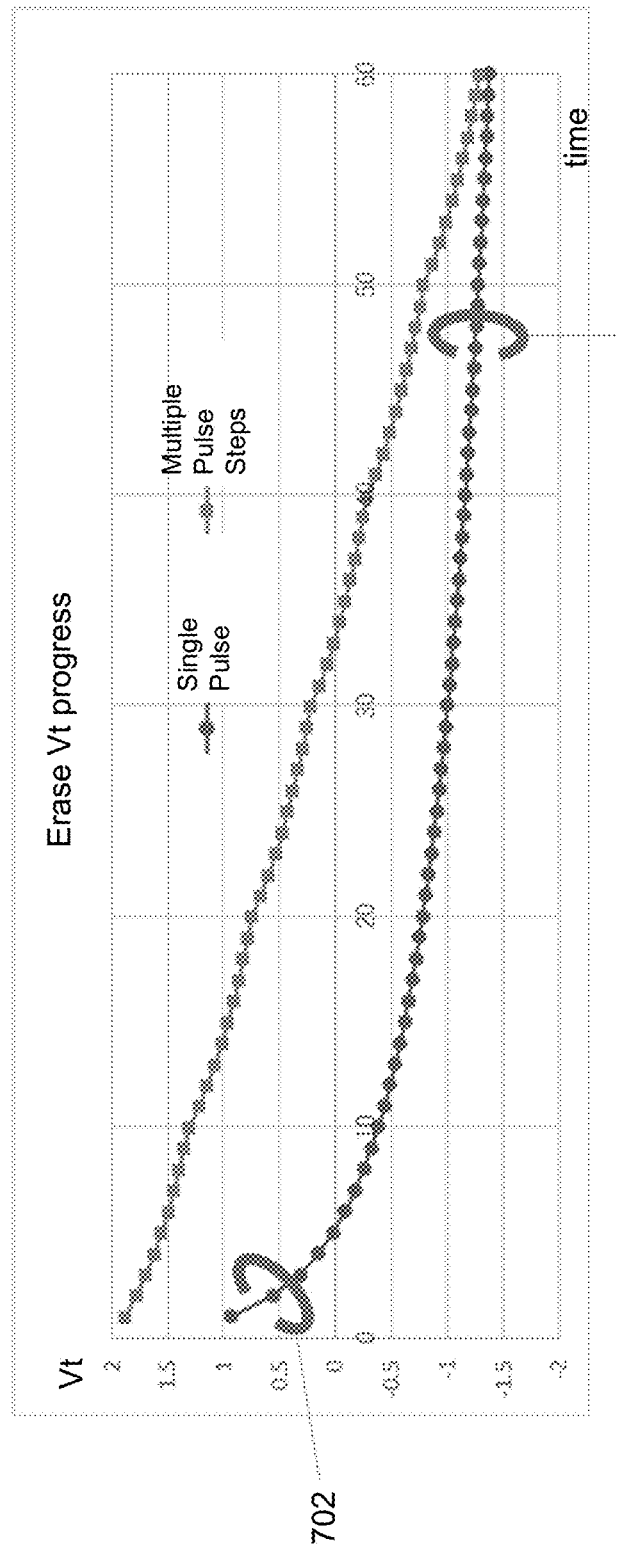
FIG. 7 is a graph that compares threshold voltage progress during an erase operation that uses a single pulse compared to using the series of increasingly-higher pulse steps according to some embodiments.

FIG. 7 is a graph that compares threshold voltage progress during an erase operation that uses a single pulse (bottom curve) compared to using the series of increasingly-higher pulse steps (top curve) according to some embodiments. As illustrated with reference to the single pulse curve, it is difficult to accurately suspend an erase operation because of rapid changes in the Vt distribution, particularly at an early portion 702 of the single pulse curve. Further, it is difficult to accurately resume an erase operation because, as illustrated at a latter portion 704 of the single pulse curve, even small decreases of erase voltage can hamper an erase progress after resume.

In contrast, use of the multiple increasingly-higher-voltage pulse steps (top curve) results in a more linear progress of the Vt distribution. The linear progression of the Vt distribution enables accurate prediction of the Vt distribution erase progress over time. Thus, it is also easier to suspend the erase operation and come back to accurately resume the erase operation by employing the disclosed techniques of using increasingly-higher-voltage pulse steps in lieu of one long pulse step.

Figure 8:
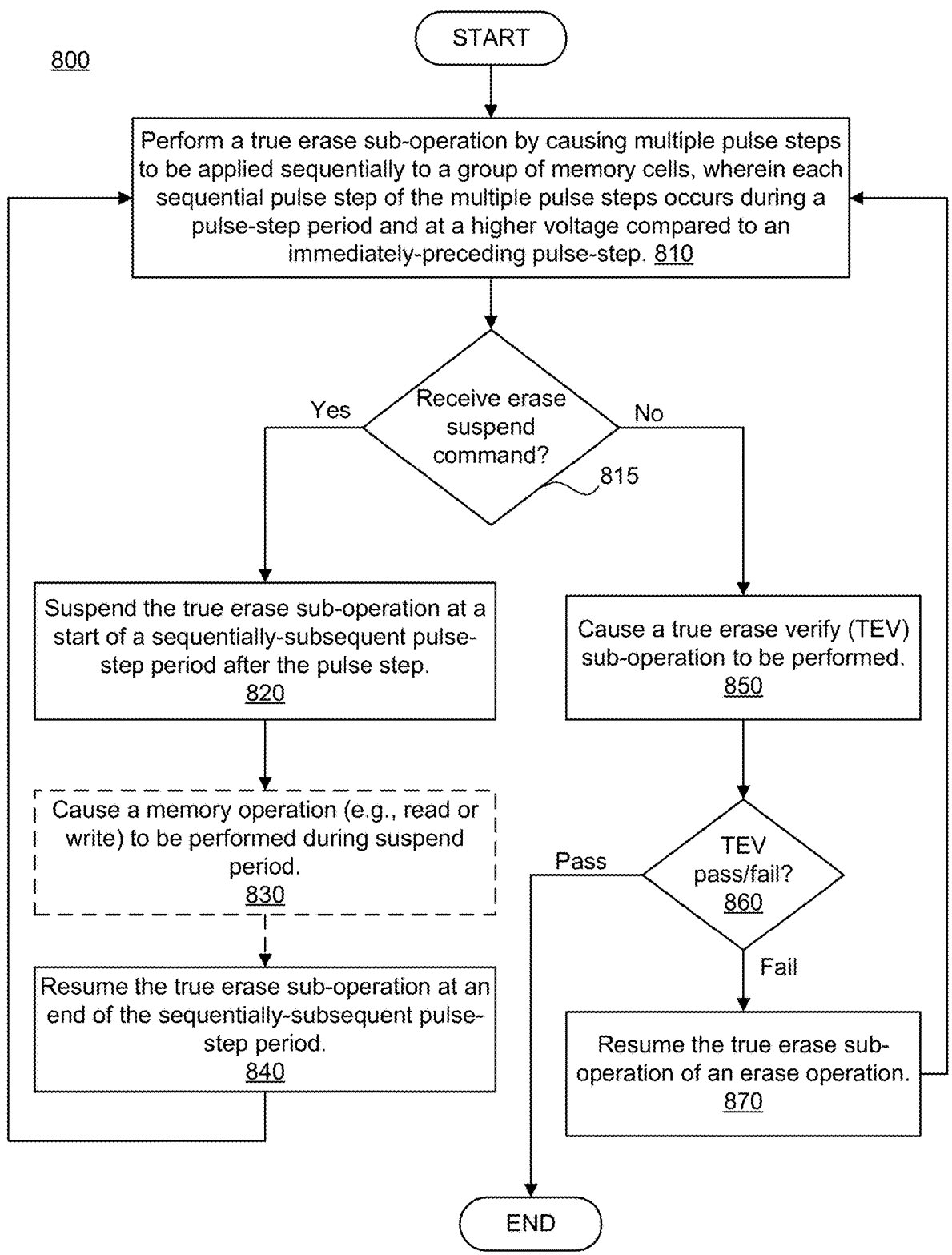
FIG. 8 is a flow diagram of an example method of performing a true erase employing multiple pulse steps according to some embodiments.

FIG. 8 is a flow diagram of an example method 800 of performing a true erase employing multiple pulse steps according to some embodiments. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the local media controller 135 of FIGS. 1A-1B that includes an erase operation manager 138. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, a true erase sub-operation is performed. More specifically, the processing logic performs a true erase sub-operation by causing multiple pulse steps to be applied sequentially to a group of memory cells of the memory array. In some embodiments, each sequential pulse step of the multiple pulse steps occurs during a pulse-step period and at a higher voltage compared to an immediately-preceding pulse-step, as illustrated in FIG. 5B.

At operation 815, erase suspend commands are detected. More specifically, processing logic determines whether an erase suspend command has been received.

If, at operation 815, an erase command is received, at operation 820, the processing logic suspends the true erase sub-operation at a start of a subsequent pulse-step period after the pulse step, as illustrated in FIG. 6A.

At operation 830, a memory operation is optionally also handled. More specifically, the processing logic causes a memory operation (such as a read operation or a write operation) to be performed during the suspend period, e.g., the subsequent pulse-step period.

At operation 840, the true erase sub-operation is resumed (FIG. 6A). More specifically, the processing logic resumes the true erase sub-operation at the end of the subsequent pulse-step period. In some embodiments, resuming the true erase sub-operation at the end of the subsequent pulse-step period is in response to receiving an erase resume command before the end of the subsequent pulse-step period, as illustrated in FIG. 6A.

If, at operation 815, no erase suspend command is received (or no additional erase suspend command is received after resuming the true erase sub-operation at operation 840), then the method 800 continues to operation 850.

At operation 850, a true erase verify sub-operation is performed. More specifically, the processing logic causes a true erase verify (TEV) sub-operation to be performed, which was discussed with reference to FIG. 4B.

At operation 860, verify pass/fail is determined. More specifically, the processing logic determines whether the true erase verify sub-operation passed or failed, which was discussed with reference to FIG. 4B.

If, at operation 860, the true erase verify sub-operation passed, the erase operation ends. In response to, at operation 860, the true erase verify sub-operation resulting in a failure, at operation 870, the processing logic resumes the true erase sub-operation of the erase operation, as illustrated in FIG. 6B. In at least some embodiments, a subsequent pulse step after resuming the true erase sub-operation is a higher voltage than a pulse step that was sent immediately before performing the true erase verify sub-operation.

Figure 9:
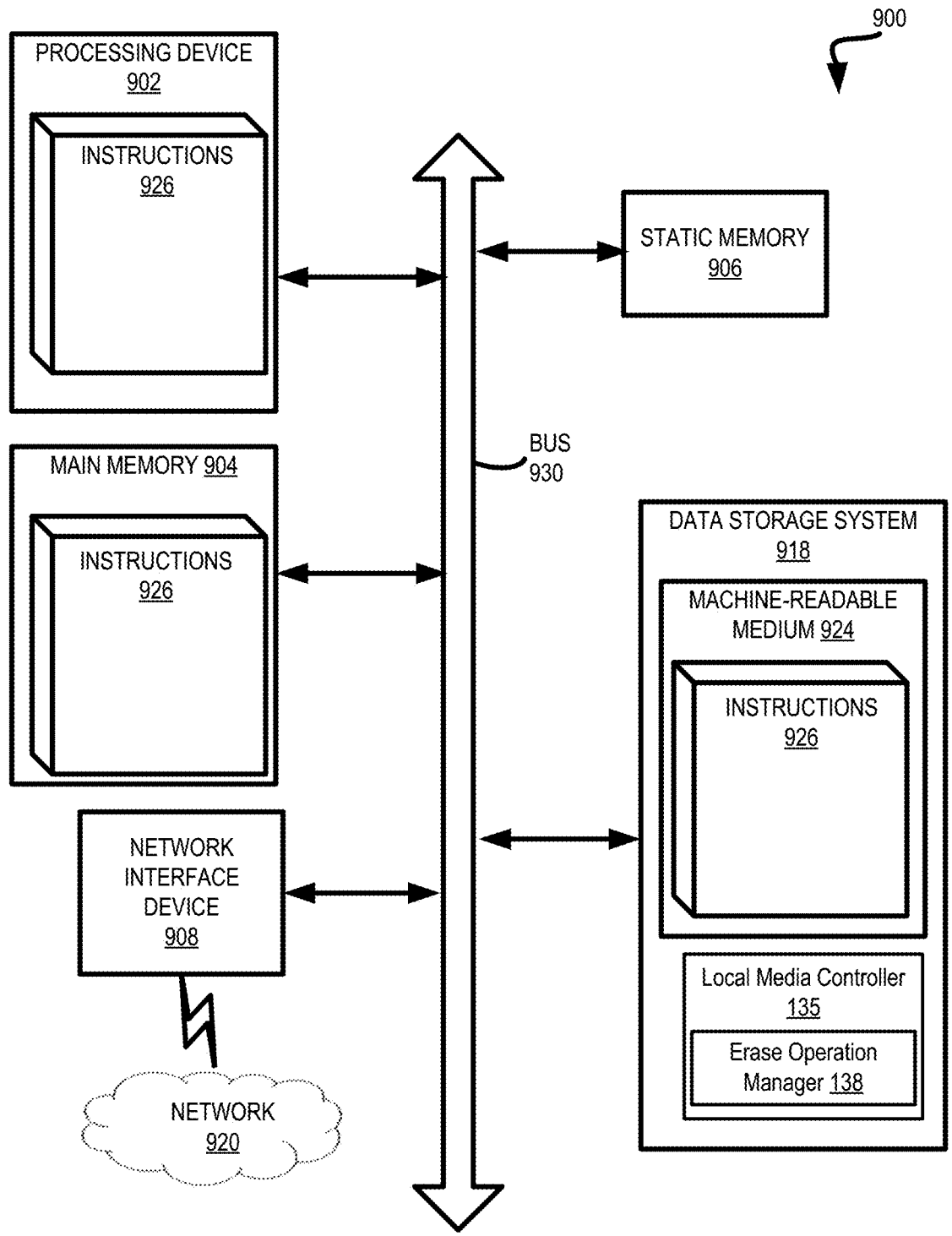
FIG. 9 is a block diagram of an example computer system in which embodiments of the present disclosure can operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the memory sub-system controller 115 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 910 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 928 for performing the operations and steps discussed herein. The computer system 900 can further include a network interface device 912 to communicate over the network 920.

The data storage system 918 can include a machine-readable storage medium 924 (also known as a non-transitory computer-readable medium) on which is stored one or more sets of instructions 928 or software embodying any one or more of the methodologies or functions described herein. The data storage system 918 can further include the local media controller 135, which includes the erase operation manager 138, which were previously discussed. The instructions 928 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1A.

In one embodiment, the instructions 926 include instructions to implement functionality corresponding to a controller (e.g., the memory sub-system controller 115 of FIG. 1A). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., non-transitory computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array comprising memory cells; and
control logic operatively coupled to the memory array, the control logic to perform memory erase operations comprising:
performing a true erase sub-operation by causing multiple pulse steps to be applied sequentially to a group of memory cells of the memory array, wherein each sequential pulse step of the multiple pulse steps occurs during a pulse-step period and at a higher voltage compared to an immediately-preceding pulse-step;
in response to detecting an erase suspend command during a pulse step, suspending the true erase sub-operation at a start of a subsequent pulse-step period after the pulse step; and
resuming the true erase sub-operation at an end of the subsequent pulse-step period.

2. The memory device of claim 1, wherein the group of memory cells is a block of memory cells.

3. The memory device of claim 1, wherein the multiple pulse steps comprise at least three pulse steps.

4. The memory device of claim 1, wherein the memory erase operations further comprise causing, during the subsequent pulse-step period, a read operation to be performed.

5. The memory device of claim 1, wherein the memory erase operations further comprise, in response to a true erase verify sub-operation resulting in a failure, resuming the true erase sub-operation of an erase operation.

6. The memory device of claim 5, wherein a subsequent pulse step after resuming the true erase sub-operation comprises a higher voltage than a pulse step that was applied immediately before performing the true erase verify sub-operation.

7. The memory device of claim 1, wherein resuming the true erase sub-operation at the end of the subsequent pulse-step period is in response to receiving an erase resume command before the end of the subsequent pulse-step period.

8. A method comprising:
performing, by control logic of a memory device, a true erase sub-operation by causing multiple pulse steps to be applied sequentially to a group of memory cells of a memory array,
wherein each sequential pulse step of the multiple pulse steps occurs during a pulse-step period and at a higher voltage compared to an immediately-preceding pulse-step;
in response to detecting an erase suspend command during a pulse step, suspending, by the control logic, the true erase sub-operation at a start of a subsequent pulse-step period after the pulse step; and
resuming, by the control logic, the true erase sub-operation at an end of the subsequent pulse-step period.

9. The method of claim 8, wherein the group of memory cells is a block of memory cells.

10. The method of claim 8, wherein the multiple pulse steps comprise at least three pulse steps.

11. The method of claim 8, further comprising causing, during the subsequent pulse-step period, a read operation to be performed.

12. The method of claim 8, further comprising, in response to a true erase verify sub-operation resulting in a failure, resuming the true erase sub-operation of an erase operation.

13. The method of claim 12, wherein a subsequent pulse step after resuming the true erase sub-operation comprises a higher voltage than a pulse step that was applied immediately before performing the true erase verify sub-operation.

14. The method of claim 8, wherein resuming the true erase sub-operation at the end of the subsequent pulse-step period is in response to receiving an erase resume command before the end of the subsequent pulse-step period.

15. A non-transitory computer-readable medium storing instructions, which when executed by control logic that is operatively coupled with a memory array of a memory device, the control logic performs a plurality of memory erase operations comprising:
performing a true erase sub-operation by causing multiple pulse steps to be applied sequentially to a group of memory cells of the memory array, wherein each sequential pulse step of the multiple pulse steps occurs during a pulse-step period and at a higher voltage compared to an immediately-preceding pulse-step;
in response to receiving no erase suspend command during the true erase sub-operation, causing a true erase verify sub-operation to be performed; and
in response to detecting an erase suspend command during a pulse step, suspending the true erase sub-operation at a start of a subsequent pulse-step period after the pulse step.

16. The non-transitory computer-readable medium of claim 15, wherein the plurality of memory erase operations further comprise resuming the true erase sub-operation at an end of the subsequent pulse-step period.

17. The non-transitory computer-readable medium of claim 15, wherein the plurality of memory erase operations further comprise, in response to receiving an erase resume command before an end of the subsequent pulse-step period, resuming the true erase sub-operation at the end of the subsequent pulse-step period.

18. The non-transitory computer-readable medium of claim 15, wherein the plurality of memory erase operations further comprise causing, during the subsequent pulse-step period, a read operation to be performed.

19. The non-transitory computer-readable medium of claim 15, wherein the plurality of memory erase operations further comprise:
performing the true erase sub-operation; and
in response to the true erase verify sub-operation resulting in a failure, resuming the true erase sub-operation.

20. The non-transitory computer-readable medium of claim 19, wherein a subsequent pulse step after resuming the true erase sub-operation comprises a higher voltage than a pulse step that was applied immediately before performing the true erase verify sub-operation.

* * * * *